(12) United States Patent
Reith

(10) Patent No.: US 11,651,980 B2
(45) Date of Patent: May 16, 2023

(54) TESTING APPARATUS FOR SINGULATED SEMICONDUCTOR DIES WITH SLIDING LAYER

(71) Applicant: ams AG, Premstaetten (AT)

(72) Inventor: Christoph Reith, Eindhoven (NL)

(73) Assignee: AMS AG, Premstaetten (AT)

( * ) Notice: Subject to any disclaimer, the term of this patent is extended or adjusted under 35 U.S.C. 154(b) by 57 days.

(21) Appl. No.: 16/981,790

(22) PCT Filed: Apr. 5, 2019

(86) PCT No.: PCT/EP2019/058697
§ 371 (c)(1),
(2) Date: Sep. 17, 2020

(87) PCT Pub. No.: WO2019/197295
PCT Pub. Date: Oct. 17, 2019

(65) Prior Publication Data
US 2021/0134632 A1    May 6, 2021

(30) Foreign Application Priority Data

Apr. 13, 2018   (EP) .................................. 18167293

(51) Int. Cl.
| | | |
|---|---|---|
| *H01L 21/67* | (2006.01) | |
| *G01R 1/04* | (2006.01) | |
| *G01R 1/067* | (2006.01) | |
| *G01R 31/28* | (2006.01) | |

(52) U.S. Cl.
CPC ...... *H01L 21/67259* (2013.01); *G01R 1/0408* (2013.01); *G01R 1/06722* (2013.01); *G01R 31/2831* (2013.01)

(58) Field of Classification Search
CPC ..... H01L 21/67; H01L 21/67259; G01R 1/04; G01R 1/0408; G01R 1/067; G01R 1/06711; G01R 1/06722; G01R 31/28; G01R 31/2831; G01R 3/00; G01R 1/0483
See application file for complete search history.

(56) References Cited

U.S. PATENT DOCUMENTS

| | | |
|---|---|---|
| 4,621,797 A | 11/1986 | Ziegenfuss |
| 4,784,377 A | 11/1988 | Woodward |
| 6,286,823 B1 | 9/2001 | Morghen |
| (Continued) | | |

FOREIGN PATENT DOCUMENTS

| | | |
|---|---|---|
| JP | H09-178806 | 7/1997 |
| JP | 2002-164136 | 6/2002 |
| (Continued) | | |

OTHER PUBLICATIONS

European Patent Office, International Search Report for PCT/EP2019/058697 dated Jun. 28, 2019.

*Primary Examiner* — Son T Le
(74) *Attorney, Agent, or Firm* — MH2 Technology Law Group, LLP

(57) ABSTRACT

The testing apparatus for singulated semiconductor dies comprises a nesting frame and a bottom part, which form a testing device nest adapted to the size of a semiconductor die. A pushing device is provided for an alignment of the semiconductor die in the testing device nest. An engineering plastic layer on the bottom part forms a surface on which the semiconductor die slides during its alignment.

10 Claims, 3 Drawing Sheets

(56) References Cited

U.S. PATENT DOCUMENTS

| | | | |
|---|---|---|---|
| 2006/0051995 A1* | 3/2006 | Piatti | G01R 1/0483 |
| | | | 439/166 |
| 2006/0278683 A1 | 12/2006 | Otsuka et al. | |
| 2007/0216437 A1* | 9/2007 | Slaughter | G01R 31/2893 |
| | | | 324/750.09 |
| 2007/0224867 A1 | 9/2007 | Allsup et al. | |
| 2007/0285106 A1* | 12/2007 | Henry | G01R 1/0408 |
| | | | 324/555 |
| 2010/0132736 A1 | 6/2010 | Lin et al. | |
| 2016/0320428 A1 | 11/2016 | Dunklee | |
| 2018/0188290 A1 | 7/2018 | Park et al. | |
| 2018/0299483 A1* | 10/2018 | Chen | G01R 1/0441 |

FOREIGN PATENT DOCUMENTS

| | | |
|---|---|---|
| WO | 2009/153032 | 12/2009 |
| WO | 2017/007200 | 1/2017 |

* cited by examiner

TESTING APPARATUS FOR SINGULATED SEMICONDUCTOR DIES WITH SLIDING LAYER

The present invention relates to a testing device for singulated semiconductor dies and the alignment of electric contact elements of the dies with respect to electric contact elements of the testing device.

BACKGROUND OF THE INVENTION

Testing bare silicon dies involves placing the contact elements of the dies (like solder balls, for instance) on contact elements of a testing device (like pogo pins, for instance). The silicon dies are usually dropped into the testing device nest via a chamfered opening. Then the silicon dies can be positioned by sliding them on a sliding surface, until the corresponding contact elements are connected to one another and allow a voltage or current to be applied to the dies through the testing device. The alignment is achieved by a pushing device, which may include at least two push pin devices acting in different directions.

SUMMARY OF THE INVENTION

The definitions as described above also apply to the following description unless stated otherwise.

The testing apparatus for semiconductor dies comprises a nesting frame and a bottom part, which form a testing device nest adapted to the size of a semiconductor die. A pushing device is provided for an alignment of the semiconductor die in the testing device nest. An engineering plastic layer on the bottom part forms a surface on which the semiconductor die slides during its alignment.

An embodiment of the testing apparatus further comprises a clean-out die with a polymer layer. The clean-out die is movable such that the polymer layer wipes the engineering plastic layer.

A further embodiment comprises contact elements of the testing device nest, which are reversibly movable to a position where they touch the polymer layer. The bottom part may be recessed for the contact elements. The contact elements can be pogo pins, for instance.

In further embodiments the bottom part is recessed in a keep out zone that is provided for contact elements and/or a redistribution layer of the semiconductor die.

In a further embodiment a ledge in the nesting frame forms an accommodation region for burr that is present at a lateral surface or edge of the semiconductor die.

In a further embodiment the surface on which the semiconductor die slides during its alignment has a linear dimension of 200 µm or less in a direction of sliding.

The testing device nest may especially be adapted to the alignment of singulated wafer-level chip-scale packages.

The following is a detailed description of examples of the testing apparatus in conjunction with the appended figures, which are not drawn to scale.

DETAILED DESCRIPTION

Figure 1:
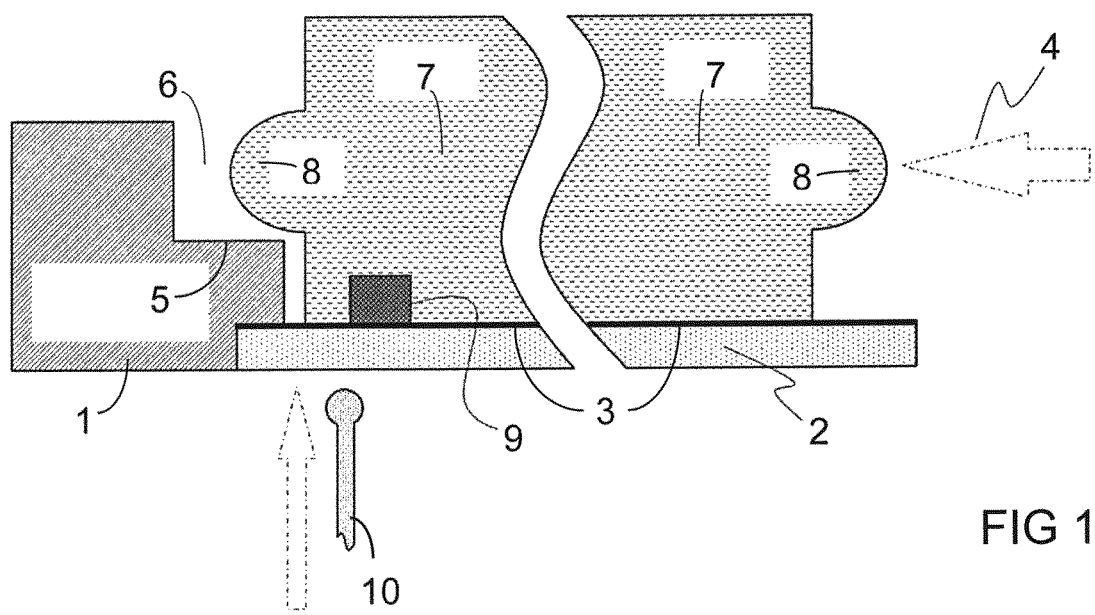
FIG. 1 is a cross section of an embodiment of the testing apparatus with an inserted semiconductor die.

FIG. 1 is a cross section of an embodiment of the testing apparatus. A testing device nest accommodates a semiconductor die 7 during a test and is formed by a nesting frame 1 and a bottom part 2, which is covered with an engineering plastic layer 3. A pushing device 4 for the alignment of the semiconductor die 7 may be configured as in conventional testing devices and is therefore only schematically indicated in FIG. 1. The pushing device 4 may especially comprise at least two push pin devices acting in different directions, for example.

The engineering plastic layer 3 is smooth and provides an enhanced sliding surface, on which the semiconductor die 7 easily slides during its alignment. In particular if a redistribution layer (RDL) is present on the bottom surface of the semiconductor die 7, the engineering plastic layer 3 is optionally provided with a cut out area. The smooth sliding surface prevents damage to the redistribution layer. Moreover, the engineering plastic can be configured to collect silicon dust/grit for later removal by a device comprising a sticky material or adhesive.

A ledge 5 may be present in the nesting frame 1 to form an accommodation region 6 for protruding burr 8 that is present at a lateral surface or edge of the semiconductor die 7. The accommodation region 6 allows a precise alignment of the semiconductor die 7 within the testing device nest, irrespective of the size and shape of the burr 8, and the engineering plastic layer 3 can be employed to its full advantage.

The semiconductor die 7 is typically provided with contact elements 9, which may in particular be solder balls or bump contacts, for instance. Contact elements 10 of the testing device nest are arranged in such a manner that they extend sufficiently far into the testing device nest to be able to contact the contact elements 9 of the semiconductor device 7. The arrangement of the contact elements 10 of the testing device nest may be similar to an arrangement of contact elements in a conventional testing device.

The contact elements 10 of the testing device nest can comprise movable parts or components and can especially be formed by pogo pins, for instance. It may be advantageous if the entire contact elements 10 are normally arranged outside the testing device nest. When a semiconductor die 7 is to be tested, the contact elements 10 are reversibly moved into a position in which they extend sufficiently far into the testing device nest. Such a movement is indicated in FIG. 1 by the vertical arrow.

Figure 2:
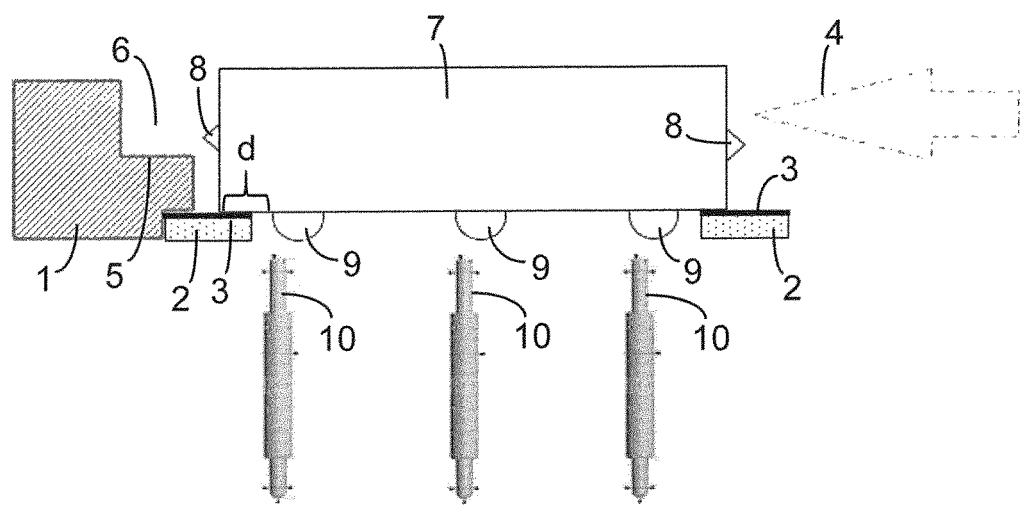
FIG. 2 is a cross section of a further embodiment of the testing apparatus with an inserted semiconductor die during the alignment process.

FIG. 2 is a cross section of a further embodiment of the testing apparatus. The elements of the embodiment according to FIG. 2 that correspond to elements of the embodiment according to FIG. 1 are designated with the same reference numerals. FIG. 2 shows the semiconductor die 7 in a position where it is not yet aligned, and the corresponding contact elements 9, 10 are not in contact with each other. The contact elements 10 of the testing device nest are illustrated as pogo pins, but other types of contact elements may be appropriate as well.

In the embodiment according to FIG. 2, the bottom part 2 is recessed to provide free space for a lateral shift of the protruding solder balls which form the contact elements 9 of the semiconductor die 7. The distance d between the lateral surface or edge of the semiconductor die 7 and the outermost solder ball can typically be about 200 µm, which suffices for the alignment of the semiconductor die 7 inside the testing device nest.

Figure 3:
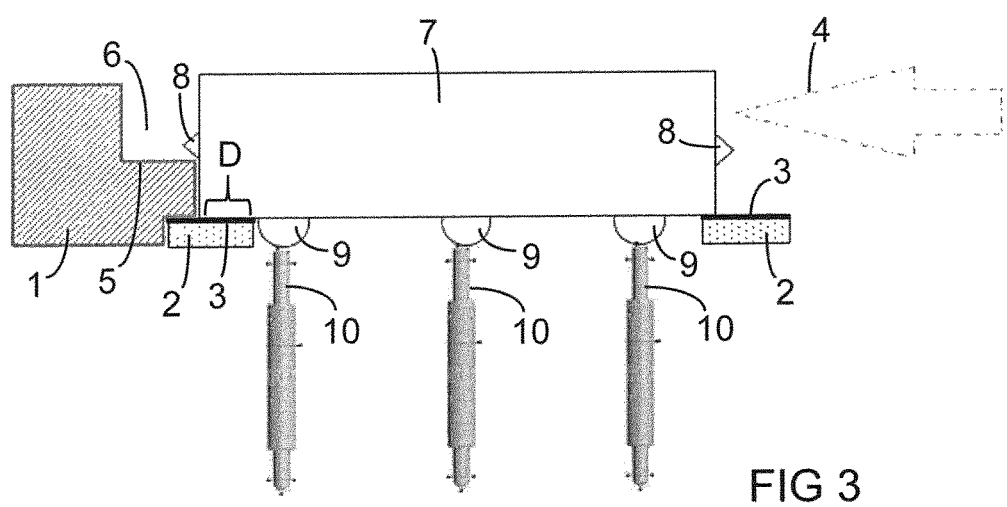
FIG. 3 is a cross section according to FIG. 2 with the semiconductor die in aligned position and contacted by e.g. pogo pins.

FIG. 3 is a cross section according to FIG. 2 with the semiconductor die in aligned and contacted position. FIG. 2 and FIG. 3 show how the contact elements 9 of the semiconductor die 7 shift within the recess of the bottom part 2 until they are precisely opposite the contact elements 10 of the testing device nest. The contact elements 9, 10 are brought into contact by a vertical shift of the contact elements 10 of the testing device nest.

In the embodiment according to FIGS. 2 and 3, only part of the bottom of the semiconductor die 7 is in contact with the engineering plastic layer 3. The surface on which the semiconductor die 7 slides may have a linear dimension D of typically 200 µm or less in the direction of sliding. The linear dimension D may in particular be smaller than the distance d between the lateral surface or edge of the semiconductor die 7 and the outermost protruding contact element 9. Friction is thus reduced to facilitate the sliding process. Moreover, if RDL traces are present on the bottom of the semiconductor die 7, the recess of the bottom part 2 provides a keep out zone and prevents the RDL traces from damage.

Figure 4:
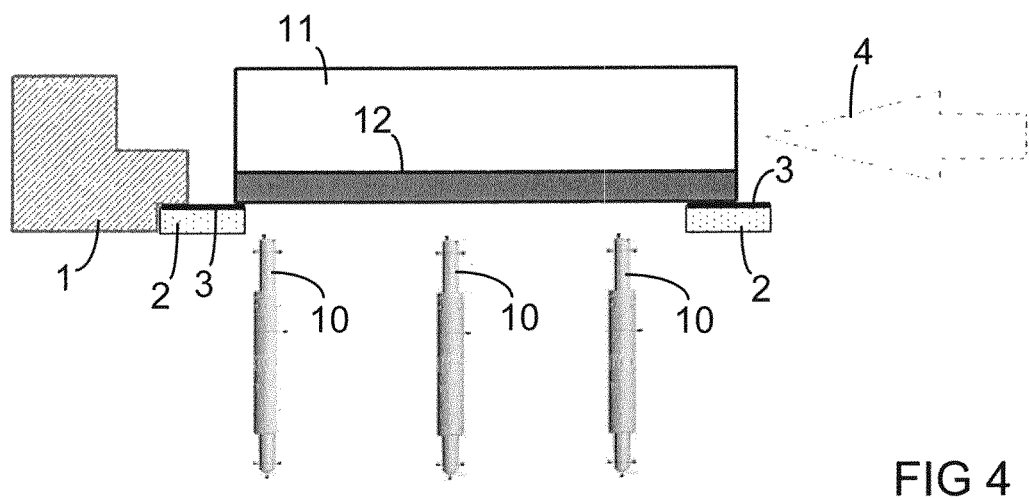
FIG. 4 is a cross section of the further embodiment of the testing apparatus with an inserted clean-out die during the alignment process.

FIG. 4 is a further cross section of the embodiment according to FIG. 2 with an inserted clean-out die 11. The clean-out die 11 serves to collect any silicon dust from the engineering plastic layer 3. The contact elements 10 of the testing device nest may also be cleaned by the clean-out die 11. FIG. 4 shows the clean-out die 7 in a position where it is not yet aligned. The pushing device 4 is used to align the clean-out die 11 inside the testing device nest.

The clean-out die 11 can be made of pure silicon, which is overmolded with a kind of polymer. The polymer layer 12 has adhesive properties and collects silicon dust or grit. During a test of a semiconductor die, the clean-out die 11 stays in a dedicated position outside the testing device nest ("parking position"). After the test of the semiconductor die 7 or after a predefined number of tests or test cycles, which can be set in advance, the clean-out die 11 is inserted in the testing device nest for the purpose of cleaning.

Figure 5:
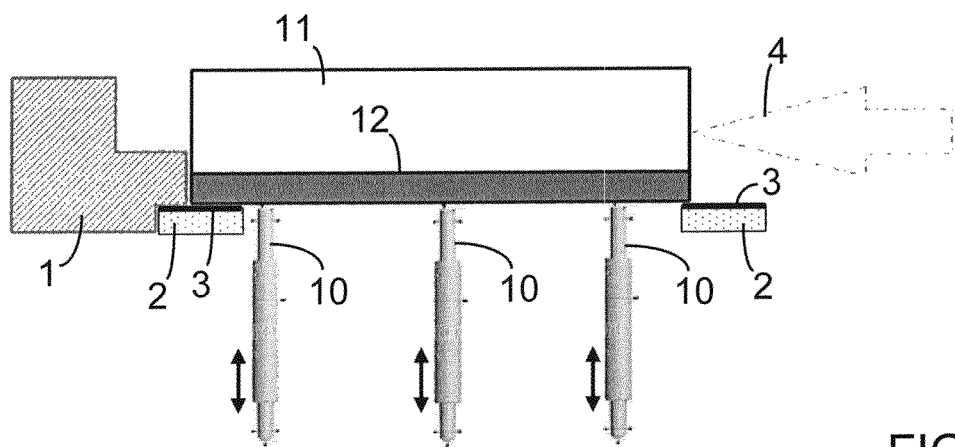
FIG. 5 is a cross section according to FIG. 4 with the clean-out die in aligned position and contacted by e.g. pogo pins.

FIG. 5 is a cross section according to FIG. 4 with the clean-out die 11 in aligned position, in which the entire sliding surface provided by the engineering plastic layer 3 is in contact with the polymer layer 12 and is thus cleaned. The contact elements 10 can be cleaned by repeatedly pushing them into the polymer layer 12. The movement of the contact elements 10 for cleaning is indicated in FIG. 5 by the vertical double arrows.

The described testing apparatus facilitates the alignment of semiconductor dies in a testing device nest and allows easy cleaning of the testing device nest. These advantages are not obtained with conventional testing devices. The described testing apparatus is in particular suitable for the alignment of singulated wafer-level chip-scale packages.

The invention claimed is:

1. A testing apparatus for singulated semiconductor dies, comprising:
  a nesting frame and a bottom part, which form a testing device nest adapted to a size of a semiconductor die;
  a pushing device for an alignment of the semiconductor die in the testing device nest;
  wherein an engineering plastic layer on the bottom part forms a surface on which the semiconductor die slides during its alignment; and
  a ledge in a sidewall of the nesting frame, wherein the semiconductor die is pushed against a sidewall of nesting frame by the pushing device, the ledge forms an accommodation region for a burr that is present at a lateral surface or edge of the semiconductor die,
  wherein the engineering plastic layer is configured to collect silicon dust, grit, or both silicon dust and grit for later removal.

2. The testing apparatus of claim 1, further comprising:
  a clean-out die with a polymer layer, the clean-out die being movable such that the polymer layer wipes the engineering plastic layer.

3. The testing apparatus of claim 2, further comprising:
  contact elements of the testing device nest, which are reversibly movable to a position where they touch the polymer layer.

4. The testing apparatus of claim 3, wherein the bottom part is recessed for the contact elements.

5. The testing apparatus of claim 3, wherein the contact elements are pogo pins.

6. The testing apparatus of claim 1, wherein the bottom part is recessed in a keep out zone that is provided for contact elements and/or a redistribution layer of the semiconductor die.

7. The testing apparatus of claim 1, wherein the surface on which the semiconductor die slides during its alignment has a linear dimension of 200 µm or less in a direction of sliding.

8. The testing apparatus of claim 1, wherein the testing device nest is adapted to the alignment of singulated wafer-level chip-scale packages.

9. A testing apparatus for singulated semiconductor dies, comprising:
  a nesting frame and a bottom part, which form a testing device nest adapted to a size of a semiconductor die;
  a pushing device for an alignment of the semiconductor die in the testing device nest,
  wherein an engineering plastic layer on the bottom part forms a surface on which the semiconductor die slides during its alignment; and
  a clean-out die with a polymer layer, the clean-out die being movable such that the polymer layer wipes the engineering plastic layer.

10. A testing apparatus for singulated semiconductor dies, comprising:
  a nesting frame and a bottom part, which form a testing device nest adapted to a size of a semiconductor die;
  a pushing device for an alignment of the semiconductor die in the testing device nest,
  wherein an engineering plastic layer on the bottom part forms a surface on which the semiconductor die slides during its alignment,
  wherein the engineering plastic layer is configured to collect silicon dust, grit, or both silicon dust and grit for later removal, and
  wherein the bottom part is recessed in a keep out zone that is provided for contact elements of the semiconductor die, wherein the recessed bottom part is configured to provide free space for a lateral shift of protruding contact elements of the semiconductor die.

* * * * *